United States Patent
Cheng et al.

(10) Patent No.: US 7,176,551 B2
(45) Date of Patent: Feb. 13, 2007

(54) FUSE STRUCTURE FOR A SEMICONDUCTOR DEVICE

(75) Inventors: Chun-Wen Cheng, Hsinchu (TW); Chia-Wen Liang, Hsinchu (TW); Richard Lee, Boashan Township, Hsinchu County (TW); Vincent Hsueh, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 13 days.

(21) Appl. No.: 10/850,201

(22) Filed: May 19, 2004

(65) Prior Publication Data

US 2005/0258504 A1 Nov. 24, 2005

(51) Int. Cl.
*H01L 29/00* (2006.01)

(52) U.S. Cl. .............................. 257/529; 257/E23.149; 438/601

(58) Field of Classification Search ................ 257/665, 257/529, 209, E23.149; 337/292; 438/132, 438/281, 601; 361/275.4
See application file for complete search history.

(56) References Cited

U.S. PATENT DOCUMENTS 5,698,895 A * 12/1997 Pedersen et al. ............ 257/665
5,708,291 A * 1/1998 Bohr et al. .................. 257/529
5,780,918 A * 7/1998 Aoki .......................... 257/529
6,337,507 B1 * 1/2002 Bohr et al. .................. 257/529
6,432,760 B1 * 8/2002 Kothandaraman et al. .. 438/215
6,436,585 B1 * 8/2002 Narayan et al. ............... 430/5
6,661,330 B1 * 12/2003 Young ........................ 337/297
6,849,929 B2 * 2/2005 Naiki ......................... 257/665
2002/0038902 A1* 4/2002 Naiki ......................... 257/529
2005/0098803 A1* 5/2005 Komatsu et al. ............ 257/232

FOREIGN PATENT DOCUMENTS

JP 61168242 A * 7/1986

* cited by examiner

*Primary Examiner*—Eugene Lee
*Assistant Examiner*—William F. Kraig
(74) *Attorney, Agent, or Firm*—J.C. Patents

(57) ABSTRACT

A fuse structure for a semiconductor device is provided. The fuse structure includes a fuse layer between the upper and lower insulating layers. The fuse layer is connected to the other metal layers through the via plugs. The fuse layer includes at least two separate blocks and at least a connecting block. For the current flowing through the separated blocks in a zig-zag path, of the fuse structure provides at least a fusing point or more than one fusing points. In this way, the negative impact of the single failed fuse can be reduced, thus increasing the reliability of the fuse structure. Also the damage to the devices adjacent to the fuse due to the heat generated by the current can be prevented because when the heat generated during the fuse blowing process will be conducted to the adjacent blocks to facilitate heat dissipation.

12 Claims, 4 Drawing Sheets

FUSE STRUCTURE FOR A SEMICONDUCTOR DEVICE

BACKGROUND OF THE INVENTION

1. Field of the Invention

This invention generally relates to a fuse structure for a semiconductor device, and more particularly to a fuse structure having multi-blocks for a semiconductor device.

2. Description of Related Art

As the size of a semiconductor device becomes smaller, the semiconductor device is more seriously affected due to impurity or defects in itself. A defect of a single diode or transistor may cause the whole chip to fail. To solve this problem, some redundant circuits connected to fuses generally will be added into the circuit. When a defect is found in a circuit, the fuses can be used to disable the defected circuit and enable the redundant circuit. For memory devices, the defected cell can be replaced by a non-defected cell to its address. Another reason to use fuses in the integrated circuits is to permanently write the controlling bytes such as ID codes into the chip.

Generally, the fuses are made of polysilicon or metal materials. Laser fuses and electronic fuses are two major types of fuses based on how the fuses are blown. The laser fuses will be blown by the laser beam; and the electronic fuses will be blown by currents. The electronic fuses are generally applied to EEPROM devices, while the laser fuses are generally applied to DRAM devices.

Generally, an integrated circuit has a passivation layer including silicon nitride, silicon oxide or both at the top thereof. To prevent the passivation layer from damage, an opening at the top layer is required and the laser beam has to focus precisely on the fuse in order not to damage the adjacent devices. However, it is common that the passivation layers neighboring to the fuses are damaged due to the strong power of the laser beam.

For the electronic polysilicon fuse application, it requires a high voltage to generate a current that is adequate to heat and rupture the fuse. When the size is getting smaller, the voltage required for blowing the fuse can be correspondingly decreased. Hence, a silicide layer is arranged on the polysilicon fuse so that an appropriate voltage can blow the fuse. Since the heat generated by the current can enhance the electron migration, the silicide layer and the polysilicon fuse will agglomerate together to make the silicide layer rupture and the grains of the polysilicon re-grow.

For the fuse to be open, either the fuse must be ruptured, or the silicide layer on the polysilicon fuse fused, or the post-burn resistance of the polysilicon fuse must be so high that the fuse may be deemed open.

As the conditions of the manufacturing process and the applied voltage frequently change, even after applying the voltage to blow the fuse, the remaining fuse may be found or the post-burn resistance is not stable, which affects the reliability and the performance of the devices. Further, the heat generated by the current my also deteriorate the adjacent devices and affects their reliability.

SUMMARY OF THE INVENTION

An object of the present invention is to provide a fuse structure that can be blown by a low voltage, and the heat generated by the current will not damage the adjacent devices.

Another object of the present invention is to provide a fuse structure having multi-blocks to enhance the reliability of the fuse structure by increasing the possible fusing points.

Still another object of the present invention is to provide a fuse structure that can be blown by a low voltage/current in the electron migration mode, thus enhancing the reliability of the fuse structure.

The present invention provides a fuse structure for a semiconductor device, comprising: a first insulating layer on a substrate; a fuse layer on the first insulating layer, the fuse layer including a plurality of blocks and a plurality of connecting blocks, each connecting block connecting two neighboring blocks, while the blocks being not connected one another except for connection by the connecting blocks; a second insulating layer on the fuse layer, the second insulating layer including a plurality of via plugs; a first top metal layer on the second insulating layer and connected to the plurality of via plugs; and a second top metal layer on the second insulating layer and connected to the plurality of via plugs.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE PREFERRED EMBODIMENTS

Figure 1:
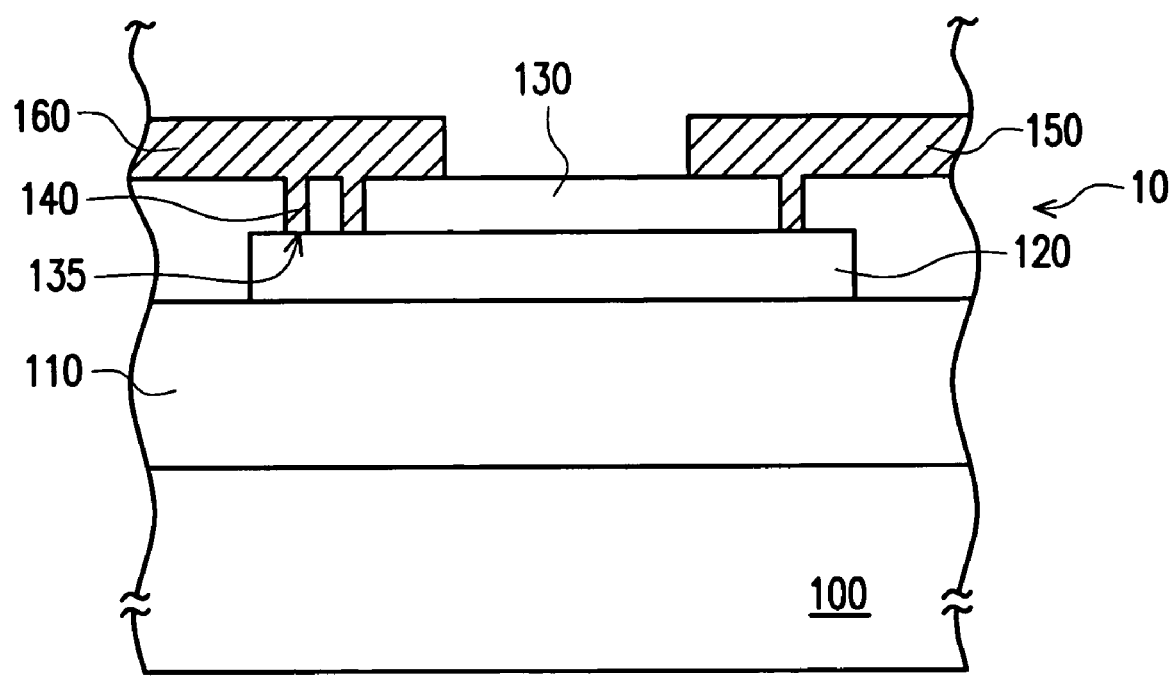
FIG. 1 is a cross-sectional view of a fuse structure in accordance with one preferred embodiment of the present invention.

FIG. 1 is a cross-sectional view of a fuse structure in accordance with one preferred embodiment of the present invention. The fuse structure 10 is formed within a semiconductor device or an IC. The fuse structure 10 is formed on a substrate 100. The substrate 100 may further include another semiconductor device element (not shown) formed thereon. A lower insulating layer 110 is formed on the substrate 100. In a preferred embodiment, the lower insulating layer 110 includes an oxide layer such as a silicon oxide layer or spin-on glass layer. A fuse layer 120 is formed on the lower insulating layer 110. The fuse layer 120 can be a composite layer including a polysilicon layer and a silicide layer, for example. The material of the silicide layer can be titanium silicide, cobalt silicide, nickel silicide, or platinum silicide. The fuse layer 120 also can be a metal layer or an alloy layer. The material of the metal layer can be titanium, tungsten, aluminum, or copper.

The thickness of the fuse layer 120 is adjustable. In fact, the resistance of the fuse layer can be adjusted by changing the material, shape (including length, width) and thickness of the fuse layer. Generally, the resistivity of the fuse layer is higher than the other metal line and the interconnects for an ideal fuse structure.

An upper insulating layer 130 is formed to cover the fuse layer 120. The upper insulating layer 130 includes an oxide layer such as a silicon oxide layer or SOG. Then a patterned photoresist layer (not shown) is formed as a mask to define the via hole 135. The number and size of the via holes can be varied depending on the needs of the layout design and thermal dissipation. A plurality of via holes 135 is formed within the upper insulating layer 130 to connect the subsequently formed top metal pad layers 150 and 160, and the fuse layer 120. After removing portions of the upper insulating layer not covered by the photoresist layer, a plurality of via plugs 140 is formed within the via holes 135. The locations of the via plugs can be adjusted for better thermal dissipation. The via plugs can be formed by sputtering a metal layer (not shown) to fill the via holes and etching back the undesired metal until the metal layer levels with the upper insulating layer. Then the first and second top metal pad layers 150 and 160 are formed on the upper insulating layer 130 and the via plugs 140.

Figure 2:
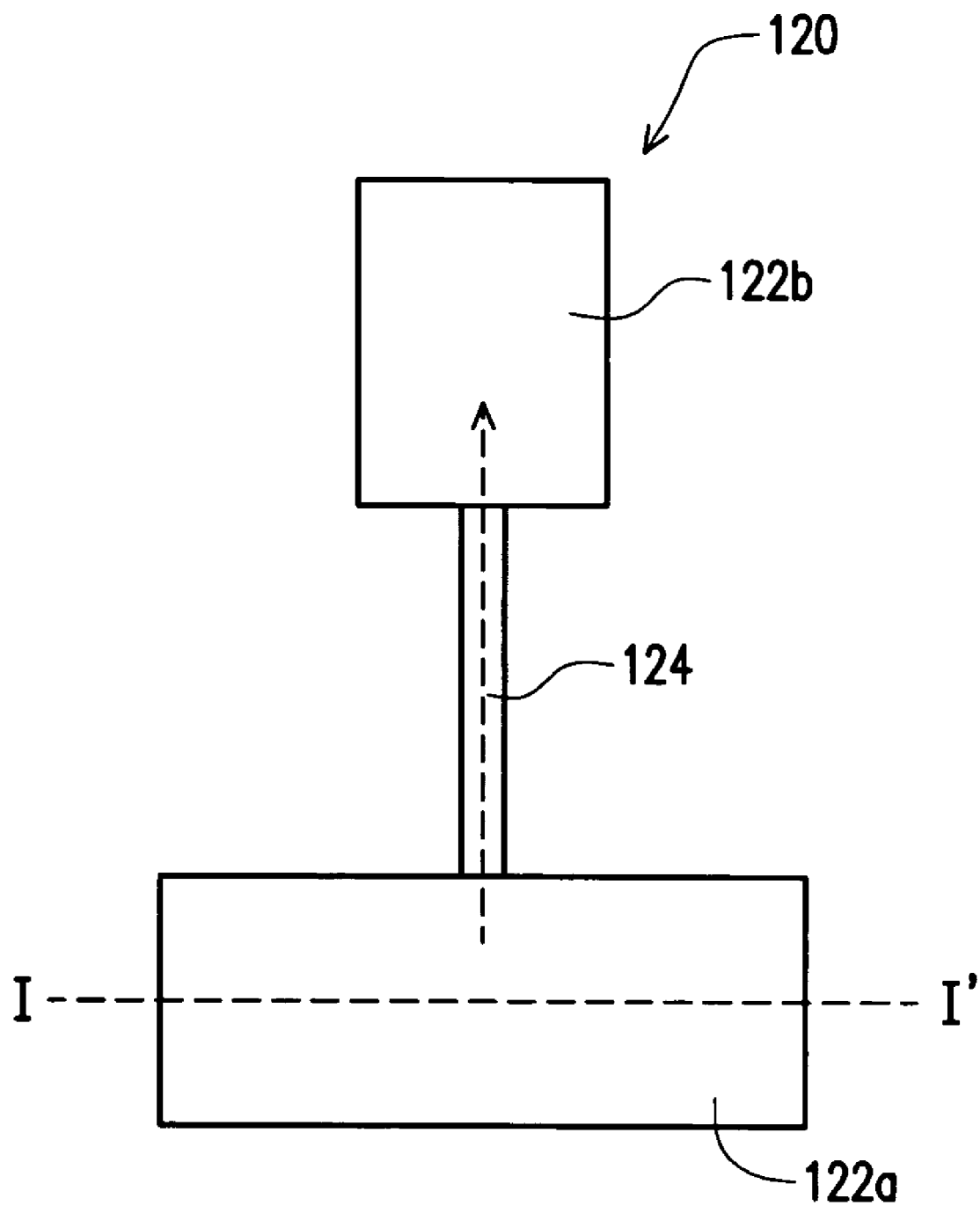
FIG. 2 is a top view of a fuse structure in accordance with one preferred embodiment of the present invention.

When a current is applied to the first top metal pad layer 150, the current flows to the fuse layer 120 through the via plugs 140, and then enters the second top metal pad layer 160 through the via plugs 140. The application of the current can also be in the reverse direction based on the design of the device. FIG. 2 is a top view of the fuse structure in FIG. 1. In a preferred embodiment, the fuse layer 120 has two wider areas 122a and 122b and a narrower area 124 between the two wider areas 122a and 122b. For example, the first top metal pad layer 150 is electrically connected to the wider area 122a though via plugs 140, while the second top metal pad layer 160 is electrically connected to the wider area 122b through via plugs 140. When the current (flowing in the direction of the arrow) flows from the area 122a through the area 124 to the area 122b, because the area 124 is narrower, the current density flowing through the area 124 is higher. Likewise, when the current flows from the area 122b through the area 124 to the area 122a, because the area 124 is narrower, the current density flowing through the area 124 is higher.

Hence, compared with the wider areas 122a and 122b, the area 124 is deemed to be a high-resistance narrow channel with higher current density flowing there-through, which results in higher temperature and electron migration in this local area 124. Therefore, the area 124 is considered a fusing point because it is narrower and is thus easy to be blown out. The width ratios between the wider areas 122a/122b and the narrower area 124 should be optimized for occurrence of electron migration and can be adjusted according to the requirements of burning fuse currents for various devices. Similarly, the length of the area 124 (i.e. the distance between two wider areas 122a/122b) can be carefully arranged based on thermal buffer consideration and optimized for occurrence of electron migration. Preferably, the distance is equivalent or larger than 0.8 microns. Based on this design, only a smaller current (preferably less than 0.1 A) or voltage is required to blow out the narrower portion of the fuse. The above fuse structure can be blown out in the electron migration mode, without rupturing the fuse structure.

Alternatively, the present invention further provides a fuse structure having multiple blocks to prevent the device from being damaged by the heat generated by the current. However, it is to be noted that the total resistance of the fuse structure is not increased.

Figure 3:
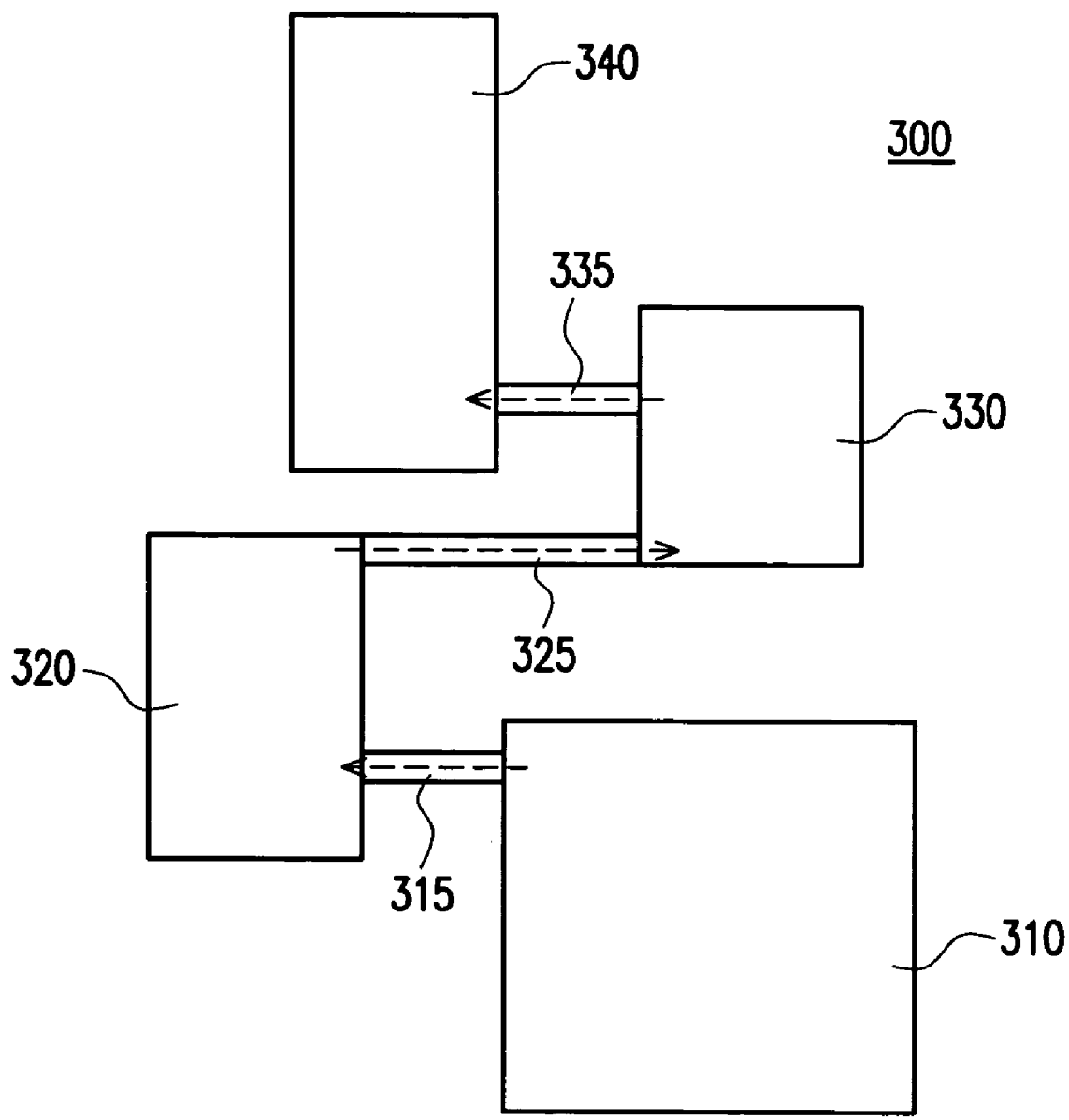
FIG. 3 is a top view of a fuse structure in accordance with another preferred embodiment of the present invention.

In another preferred embodiment, the fuse structure can be formed in a semiconductor device or an IC. The cross-sectional view of the fuse structure is similar to that of FIG. 1. But the fuse layer of the fuse structure described herein has multiple blocks. FIG. 3 is a top view of a fuse structure in accordance with another preferred embodiment of the present invention. The fuse layer 300 includes a first block 310, a second block 320, a third block 330, a fourth block 340, a first connecting block 315 connecting the first and second blocks 310 and 320, a second connecting block 325 connecting the second and third blocks 320 and 330, and a third connecting block 335 connecting the third and fourth blocks 330 and 340. The second and third blocks 320 and 330 are disposed between the first and fourth blocks 310 and 340. The second block 320 is close to the first block 310. The third block 330 is close to the fourth block 340. The first, second, third, and fourth blocks are not connected to one another except for the connection by the first, second, and third connecting blocks. Preferably, the via plugs are connected to the terminal blocks of the fuse layer 300. For example, the first top metal pad layer 150 (in FIG. 1) is electrically connected to the first block 310 though via plugs 140, while the second top metal pad layer 160 is electrically connected to the fourth block 340 through via plugs 140.

When the current (in the direction of the arrow) flows from the first block 310 through the first connecting block 315, the second block 320, the second connecting block 325, the third block 330, the third connecting block 335 to the fourth block 340, because the area for any of the connecting blocks 315, 325, and 335 is smaller compared to its neighboring blocks 310, 320, 330 and 340, the current density flowing through the connecting blocks 315, 325, and 335 is higher. Hence, the connecting blocks 315, 325, and 335 are deemed to be high-resistance narrow channels with higher current density flowing through, which results in higher temperature and enhanced electron migration in the connecting blocks 315, 325, and 335. The connecting blocks 315, 325, and 335 are considered fusing points because they are narrower and are thus easy to be blown out (open by high post-burn resistance). Likewise, when the current flows from the fourth block 340 to the first block 310, because the area for any of the connecting blocks 315, 325, and 335 is smaller compared to its neighboring blocks 310, 320, 330 and 340, the current density flowing through the connecting blocks 315, 325, and 335 is higher and the connecting blocks 315, 325, and 335 are considered fusing points.

Figure 4:
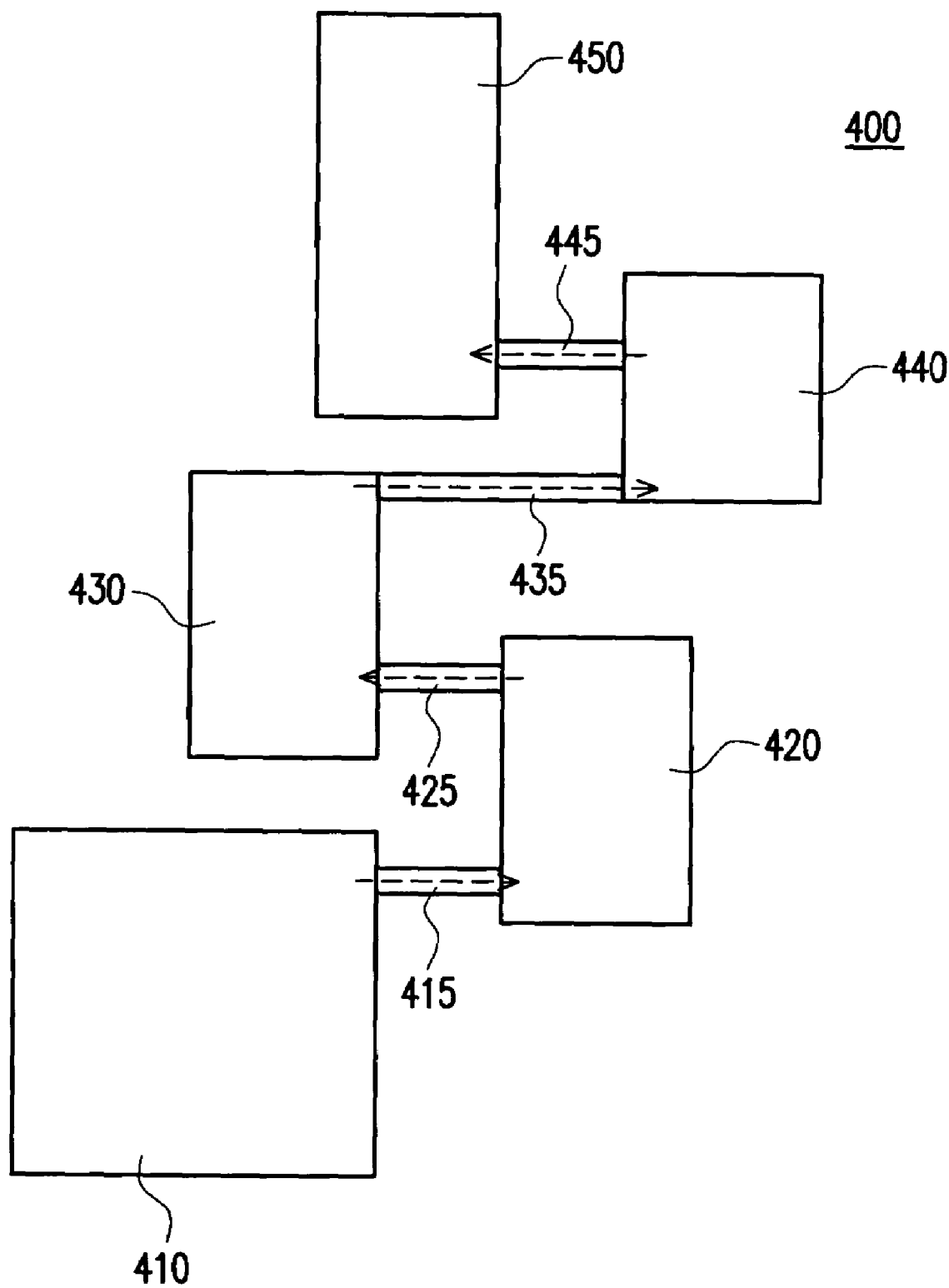
FIG. 4 is a top view of a fuse structure in accordance with another preferred embodiment of the present invention.

In another preferred embodiment, the fuse structure can be formed in a semiconductor device or an IC. The cross-sectional view of the fuse structure is similar to that of FIG. 1, but the fuse layer of the fuse structure described herein has multiple blocks. FIG. 4 is a top view of a fuse structure in accordance with another preferred embodiment of the present invention. The fuse layer 400 includes a first block 410, a second block 420, a third block 430, a fourth block 440, a fifth block 450, a first connecting block 415 connecting the first and second blocks 410 and 420, a second connecting block 425 connecting the second and third blocks 420 and 430, a third connecting block 435 connecting the third and fourth blocks 430 and 440, and a fourth connecting block 445 connecting the fourth and fifth blocks 440 and 450. The second, third and fourth blocks 420, 430 and 440 are disposed between the first and fifth blocks 410 and 450. The second block 420 is close to the first block 410. The third block 430 is disposed between the second and fourth blocks 420, 440. The fourth block 440 is close to the fifth block 450. The first, second, third, fourth and fifth blocks are not connected to one another except for the connection by the first, second, third and fourth connecting blocks. Preferably, the via plugs are connected to the terminal blocks of the fuse layer 400. For example, the first top metal pad layer 150 (in FIG. 1) is electrically connected to the first block 410 though via plugs 140, while the second top metal pad layer 160 is electrically connected to the fifth block 450 through via plugs 140.

When the current (in the direction of the arrow) flows from the first block 410 through the first connecting block 415, the second block 420, the second connecting block 425, the third block 430, the third connecting block 435, the fourth block 440, then the fourth connecting block 445 to the fifth block 450, because the area for any of the connecting blocks 415, 425, 435 and 445 is smaller compared to its neighboring blocks 410, 420, 430, 440 and 450, the current density flowing through the connecting blocks 415, 425, 435 and 445 is higher. Hence, the connecting blocks 415, 425, 435 and 445 are deemed to be high-resistance narrow channels with higher current density flowing through, which results in higher temperature and enhanced electron migration in the connecting blocks 415, 425, 435 and 445. The connecting blocks 415, 425, 435 and 445 are considered fusing points because they are narrower and are thus easy to be blown out (open by high post-burn resistance). Likewise, when the current flows from the fifth block 450 to the first block 410, because the area for any of the connecting blocks 445, 435, 425 and 415 is smaller compared to its neighboring blocks, the current density flowing through the connecting blocks 445, 435, 425 and 415 is higher and the connecting blocks 415, 425, 435 and 445 are considered as fusing points.

The width ratios between the wider blocks and the neighboring narrower connecting blocks can be optimized for occurrence of electron migration and adjusted according to the requirements of burning fuse currents for various devices. Likewise, the length of the connecting blocks (i.e. the distance between two adjacent wider blocks) can be carefully arranged based on thermal buffer consideration and optimized for occurrence of electron migration.

Compared to FIG. 2, since the fuse layer 300, 400 of this embodiment has multiple separate blocks and multiple connecting blocks, the current path is in a zig-zag fashion and longer and a plurality of fusing points are arranged within the connecting blocks. Once the resistance of any fusing point is so high that can be deemed open after applying the voltage, the fuse structure for the circuit is blown out. Accordingly, the above design, not only requires a smaller current/voltage to blow out the narrower portion of the fuse layer, but also it reduces the failing rate for opening the circuit by arranging multiple fusing points for the fuse layer. It is to be noted that any one of the fusing points in the fuse structure of the present invention can be blown out to render the fuse structure open. Even if one of the fusing points is not completely blown out, or the post-burn resistance of any one is not stable (i.e. not high enough), the fuse structure can still be rendered open. Hence, the reliability of the fuse structure is increased and performance of the adjacent device will not be adversely affected.

The number and the arrangement of the blocks or the connecting blocks or the materials and the manufacture processes for the fuse structure are not limited to the preferred embodiments described herein, but can be adjusted according to the requirements of electrical properties or layout design needed for the device or the IC, by using any known mechanism or technique in this field.

Further, because the current path meanders through the blocks, the heat generated by the current will be uniformly dissipated from the connecting blocks (fusing points) to the adjacent wider blocks, which can prevent the devices adjacent to the fusing points from overheating. That is, the heat generated in the connecting blocks when the fusing points are blown out will be conducted to the adjacent blocks, thus facilitating heat dissipation.

Hence, the fuse structure of the present invention includes multiple separate blocks and connecting blocks so that the current path in the fuse structure is arranged in a zig-zag fashion and longer. Because the current flows meanderingly through the blocks and the resultant multiple fusing points, the negative impact of the fuse remnant can be reduced, and the reliability and heat dissipation of the fuse structure are improved. For the devices adjacent to the fuse, the risks of overheating are reduced and the fuse blowing process tolerance window is thus increased because the heat generated by the current will be conducted to the adjacent blocks and will not adversely impact the adjacent devices.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A fuse structure for a semiconductor device, comprising:
   a first insulating layer, disposed on a substrate;
   a fuse layer disposed on said first insulating layer, said fuse layer including at least a polysilicon layer and a silicide layer comprising a plurality of blocks including a first block, a second block, a third block, a fourth block, and a plurality of connecting blocks including a first connecting block connecting said first and second blocks, a second connecting block connecting said second and third blocks, and a third connecting block connecting said third and fourth blocks being formed at the same layer, said second and third blocks being between said first and fourth blocks, said second block being close to said first block, said third block being close to said fourth block, said first, second, third, and fourth blocks being not connected to one another except for connection by said first, second, and third connecting blocks, wherein any of the connecting blocks has a width narrower than that of any of the blocks, at least one of the connecting blocks has a size different from that of the others of the connecting blocks, and at least one of the blocks has a size different from that of the others of the blocks;
   a second insulating layer, disposed on said fuse layer, said second insulating layer including a plurality of via plugs;
   a first top metal layer, disposed on said second insulating layer and connected to said via plugs, wherein said first top metal layer is electrically connected to said first block of said fuse layer through said via plugs; and
   a second top metal layer, disposed on said second insulating layer and connected to said via plugs, wherein said second top metal layer is electrically connected to said fourth block of said fuse layer through said via plugs.

2. The fuse structure of claim 1, wherein said silicide layer is made of a material selected from the group consisting of titanium silicide, cobalt silicide, nickel silicide, and platinum silicide.

3. The fuse structure of claim 1, wherein said first insulating layer includes a silicon oxide layer.

4. The fuse structure of claim 1, wherein said second insulating layer includes a silicon oxide layer.

5. The fuse structure of claim 1, wherein said first top metal layer includes a metal layer, and said metal layer is made of a material selected from the group consisting of titanium, tungsten, aluminum, and copper.

6. The fuse structure of claim 1, wherein said second top metal layer includes a metal layer, and said metal layer is made of a material selected from the group consisting of titanium, tungsten, aluminum, and copper.

7. A fuse structure for a semiconductor device, comprising:
   a first insulating layer, disposed on a substrate;
   a fuse layer, disposed on said first insulating layer, said fuse layer including at least a polysilicon layer and a silicide layer comprising a plurality of blocks and a plurality of connecting blocks being formed at the same layer, each of the plurality of the connecting blocks connecting two neighboring blocks, while the plurality of the blocks being not connected to one another except for connection by the plurality of the connecting blocks, wherein any of the connecting blocks has a width narrower than that of any of the blocks, at least one of the connecting blocks has a size different from that of the others of the connecting blocks, and at least one of the blocks has a size different from that of the others of the blocks;
   a second insulating layer, disposed on said fuse layer, said second insulating layer including a plurality of via plugs;
   a first top metal layer, disposed on said second insulating layer and connected to said plurality of via plugs; and
   a second top metal layer, disposed on said second insulating layer and connected to said plurality of via plugs.

8. The fuse structure of claim 7, wherein said silicide layer is made of a material selected from the group consisting of titanium silicide, cobalt silicide, nickel silicide, and platinum silicide.

9. The fuse structure of claim 7, wherein said first insulating layer includes a silicon oxide layer.

10. The fuse structure of claim 7, wherein said second insulating layer includes a silicon oxide layer.

11. The fuse structure of claim 7, wherein said first top metal layer includes a metal layer, and said metal layer is made of a material selected from the group consisting of titanium, tungsten, aluminum, and copper.

12. The fuse structure of claim 7, wherein said second top metal layer includes a metal layer, and said metal layer is made of a material selected from the group consisting of titanium, tungsten, aluminum, and copper.

* * * * *